United States Patent [19]
Olesen

[11] Patent Number: 4,746,816
[45] Date of Patent: May 24, 1988

[54] SPIKE DETECTOR CIRCUITRY

[75] Inventor: Ole V. Olesen, Annapolis, Md.

[73] Assignee: Pace Incorporated, Laurel, Md.

[21] Appl. No.: 936,778

[22] Filed: Dec. 2, 1986

Related U.S. Application Data

[62] Division of Ser. No. 535,925, Sep. 26, 1983, Pat. No. 4,639,618.

[51] Int. Cl.$^4$ ............................................. H03K 5/153
[52] U.S. Cl. .................................... 307/351; 328/151; 328/116; 324/103 P
[58] Field of Search ........ 307/351; 328/151, 115–117, 328/150; 324/103 P

[56] References Cited

U.S. PATENT DOCUMENTS

| | | | |
|---|---|---|---|
| 3,769,594 | 10/1973 | Wawra et al. | 328/151 |
| 3,792,195 | 2/1974 | Wilson et al. | 328/151 |
| 3,869,624 | 3/1975 | Fletcher et al. | 307/351 |
| 3,896,390 | 7/1975 | Bumgardner | 328/151 |
| 3,973,197 | 8/1976 | Meyer | 324/103 P |
| 4,121,119 | 10/1978 | Meigs et al. | 307/351 |
| 4,373,140 | 2/1983 | Chin | 307/351 |

Primary Examiner—John Zazworsky
Attorney, Agent, or Firm—Gerald J. Ferguson, Jr.; Michael P. Hoffman; Michael J. Foycik, Jr.

[57] ABSTRACT

Circuitry for detecting a pulse having a duration as short as 10 nanoseconds. The circuitry includes a storage device for storing the peak amplitude of the pulse. Signal resolution enhancement circuitry is responsive to the storage device for establishing a plurality of channels respectively corresponding to a plurality of signal amplitude ranges where the range of signal amplitudes for each successive range is larger than that of the range preceding it. Peak signal detecting circuitry is responsive to the signal resolution enhancement circuitry for (a) scanning the channels, (b) selecting one of the channels, the selected channel being such that the peak amplitude falls within the range for the channel, and (c) detecting the peak amplitude of the pulse.

Probe 10 in FIG. 1, may be replaced by an electrostatic sensor, the high input impedance of amplifiers 16 and 18 of FIG. 1 is within range of standard electrostatic charge measurements, thus the invention becomes an electrostatic sensing device.

16 Claims, 6 Drawing Sheets

SPIKE DETECTOR CIRCUITRY

This is a divisional application of Ser. No. 535,925, filed Sept. 26, 1983, now U.S. Pat. No. 4,639,618.

BACKGROUND OF THE INVENTION

This invention relates to spike detector circuitry.

Such circuitry is disclosed, for example, in U.S. Pat. Nos. 3,710,249; 4,053,799 and 4,069,452. These circuits have different shortcomings associated therewith which the present invention overcomes.

SUMMARY OF THE INVENTION

One object of the present invention is to measure spikes of very short duration over a wide range of amplitude with a high degree of accuracy.

A further object of the invention is to measure spikes emitted from electrical devices such as soldering and desoldering irons, etc.

It is a further object of this invention to provide a detector of the above type which may be hand held and battery operated.

It is a further object of this invention to provide a spike detector of the above type which will display the value and polarity of the spike with a duration as short as 10 nanoseconds over a range of 0-5,000 millivolts with an accuracy ±1%.

Other objects and advantages of this invention will be apparent from a reading of the following specification and claims taken with the drawing.

DETAILED DESCRIPTION OF THE PREFERRED EMBODIMENTS

Figure 1:
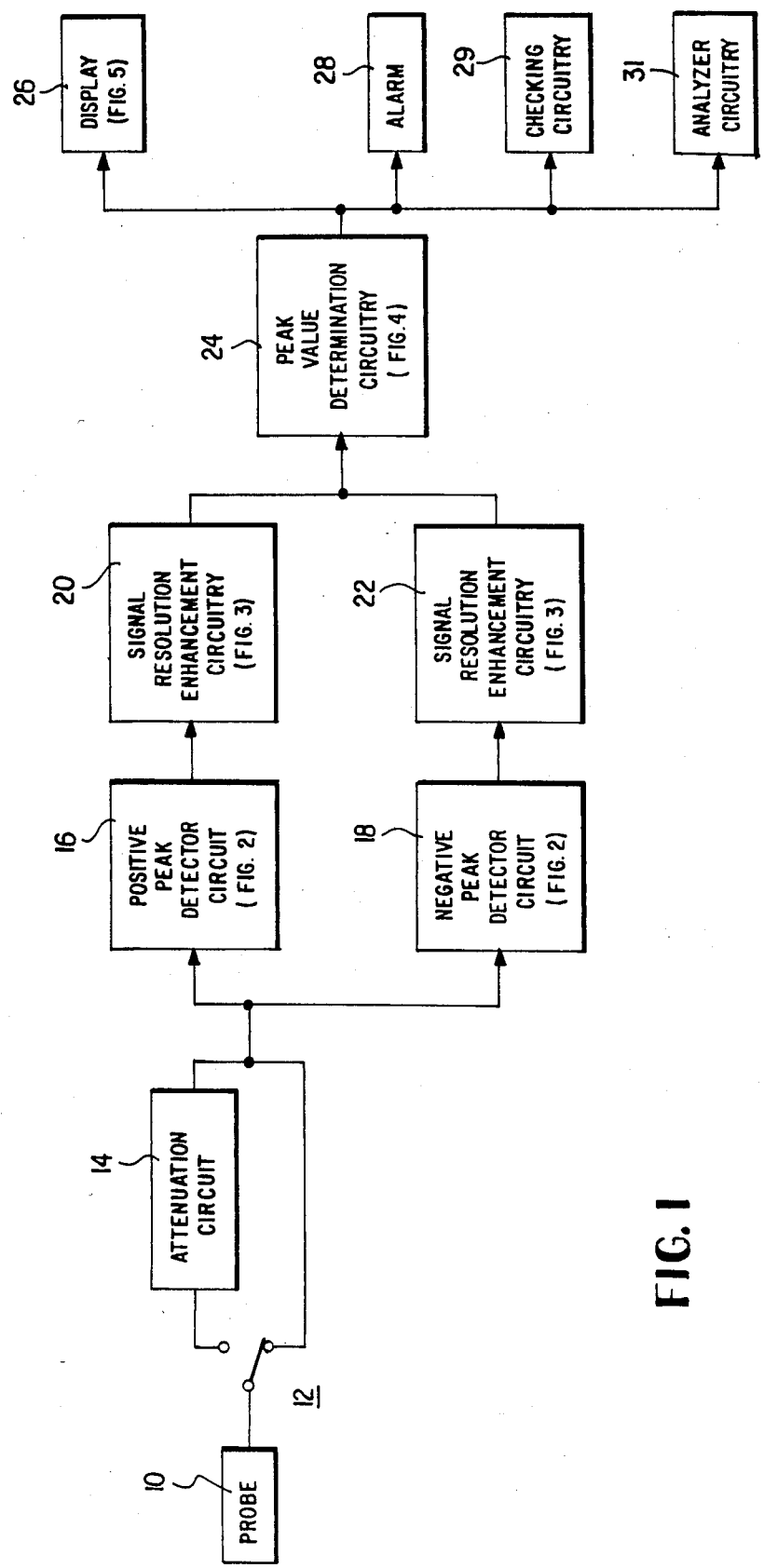
FIG. 1 is a block diagram of an illustrative spike detector in accordance with the invention.

Reference should be made to the drawing where like reference numerals refer to like parts.

Referring to FIG. 1, the spike detector includes a probe 10 which is connected to a switch 12 whereby the probe can be directly connected to positive and negative peak detector circuits 16 and 18 or indirectly thereto via an attenuation circuit 14. Circuits 16 and 18 are respectively connected to signal resolution enchancement circuitry 20 and 22. The latter circuitry is connected to peak value determination circuitry 24, which, in turn, is connected to a display 26 and optionally an alarm 28, checking circuitry 29 or analyzer circuitry 31.

Briefly, the probe 10 may constitute either a cylindrical member or a flat plate having thermal insulating, high electrical conductivity characteristics. Assuming the probe constitutes a plate, the tip of a soldering iron or desoldering device, or some other point on an electrical appliance may be placed in contact with the probe 10 where the ground of the probe would be typically connected to some grounded portion of the soldering iron or its associated heating source.

Assuming the switch 12 is in the position shown in FIG. 1, any spikes emitted from the soldering iron tip will be applied to circuits 16 and 18. Assuming the spike is positive-going, the peak will be detected and held by circuit 16.

When the switch 12 is in the FIG. 1 position, it will typically detect spikes over a range of 0-5,000 mv. In order to ensure accurate measurements especially over the low portion of this range (typically 0-50 mv), signal resolution enchancement circuitry 20 will provide greater amplification of these lower range signals, as will be described in more detail with respect to FIG. 3.

The enhanced peak signal is then applied to peak value determination circuitry 24 which determines the peak value of the detected spikes in such a manner as to ensure accurate readings of spikes of extremely small width (as small as 10 nanoseconds) with a high degree of accuracy (within ±1%). The operation of circuitry 24 is typically such that it is continually responsive to any peaks which exceed in value any peak value previously detected. Accordingly, the maximum detected peak value is displayed at display 26. Alarm 28 may be provided to monitor any excursions of the peak value over a predetermined threshold. Moreover, checking circuitry 29 may be employed to provide an indication of all peaks which occur within a predetermined range. Furthermore, analyzer circuitry 31 may be employed to provide a complete record of the spikes applied to probe 10 including the magnitude, waveform, and time of occurrence of each spike or other information related thereto. The latter circuitry may be implemented by a print-out recorder or the like.

Figure 2:
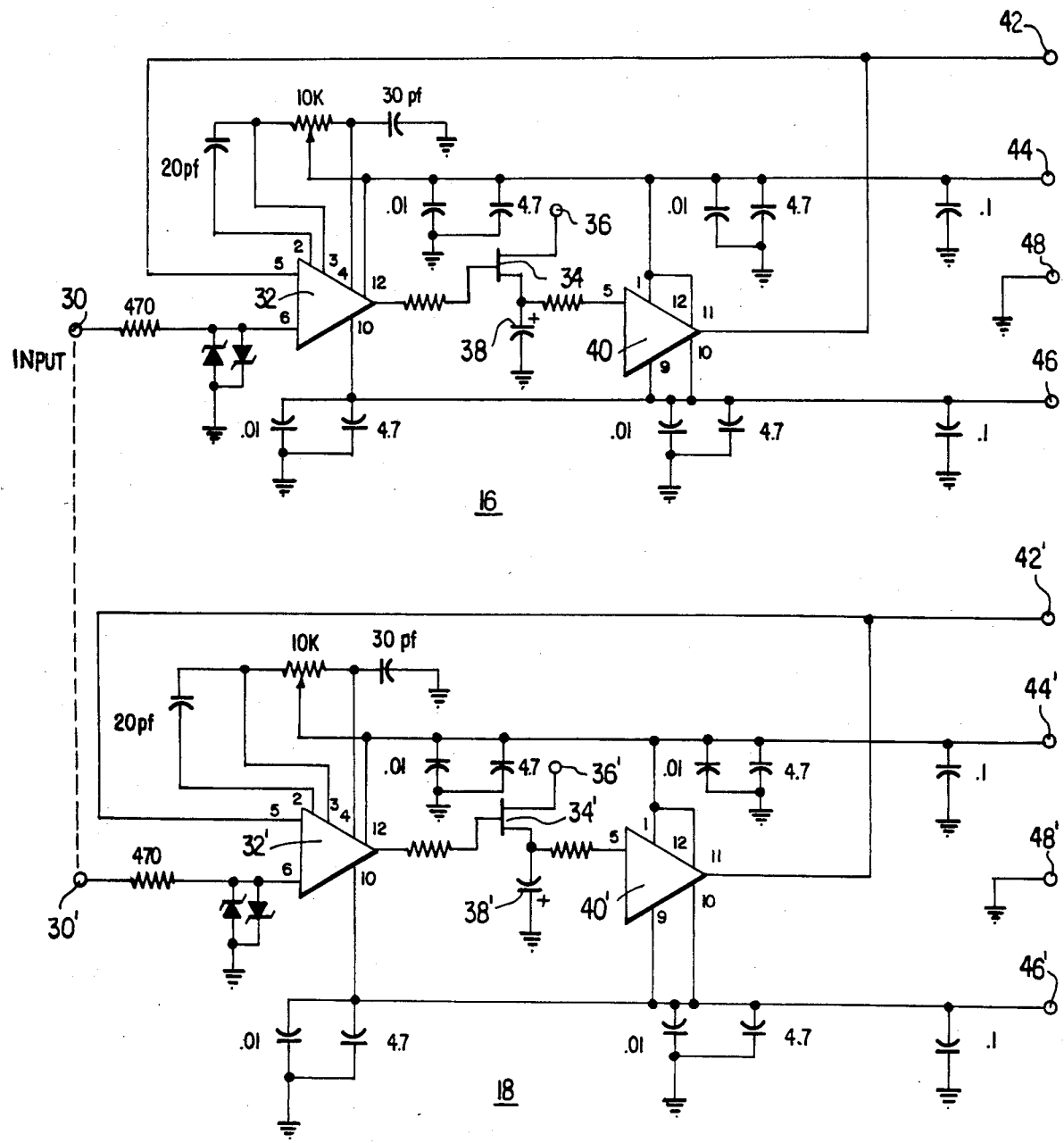
FIG. 2 is a circuit diagram of the peak detector circuitry of FIG. 1.

Referring now to FIG. 2, positive and negative peak circuits 16 and 18 are generally indicated. These circuits are substantially similar and thus, the reference numerals therefor are the same except those for circuit 18 are primed. The following description will be with respect to circuit 16, it being understood that it also applies to circuit 18 except for certain differences which will also be discussed. Terminal 30 corresponds to the input terminal of circuit 16 of FIG. 1. This terminal is connected to a wide band, differential amplifier 32. This amplifier is connected to FET 34 which, in turn, is connected between a voltage source 36 and a capacitor 38, the positive polarity of which faces the FET. The capacitor is connected to a wide band amplifier 40 which, in turn, is connected to an output terminal 42. Supply voltages for the amplifiers 32 and 40 are provided via terminals 44 and 46.

In operation, a spike is applied through amplifier 32 to forward bias FET 34 to thereby charge capacitor 38 to the peak value of the spike. This peak value is applied through amplifier 40 to terminal 42. Amplifier 40 acts as a voltage follower such that its output is also applied to differential amplifier 32 whereby its output is reduced to zero when the output from amplifier 40 rises to the value of the voltage applied from terminal 30. The capacitor 38 will then be charged to the requisite peak voltage of the spike due to the fast acting capability of the amplifiers 32 and 40. Circuit 18 differs from circuit 16 in that capacitor 38' is so polarized that its positive polarity faces ground whereby this circuit is sensitive to negative peaks as opposed to the positive peaks detected by circuit 16.

Figure 3:
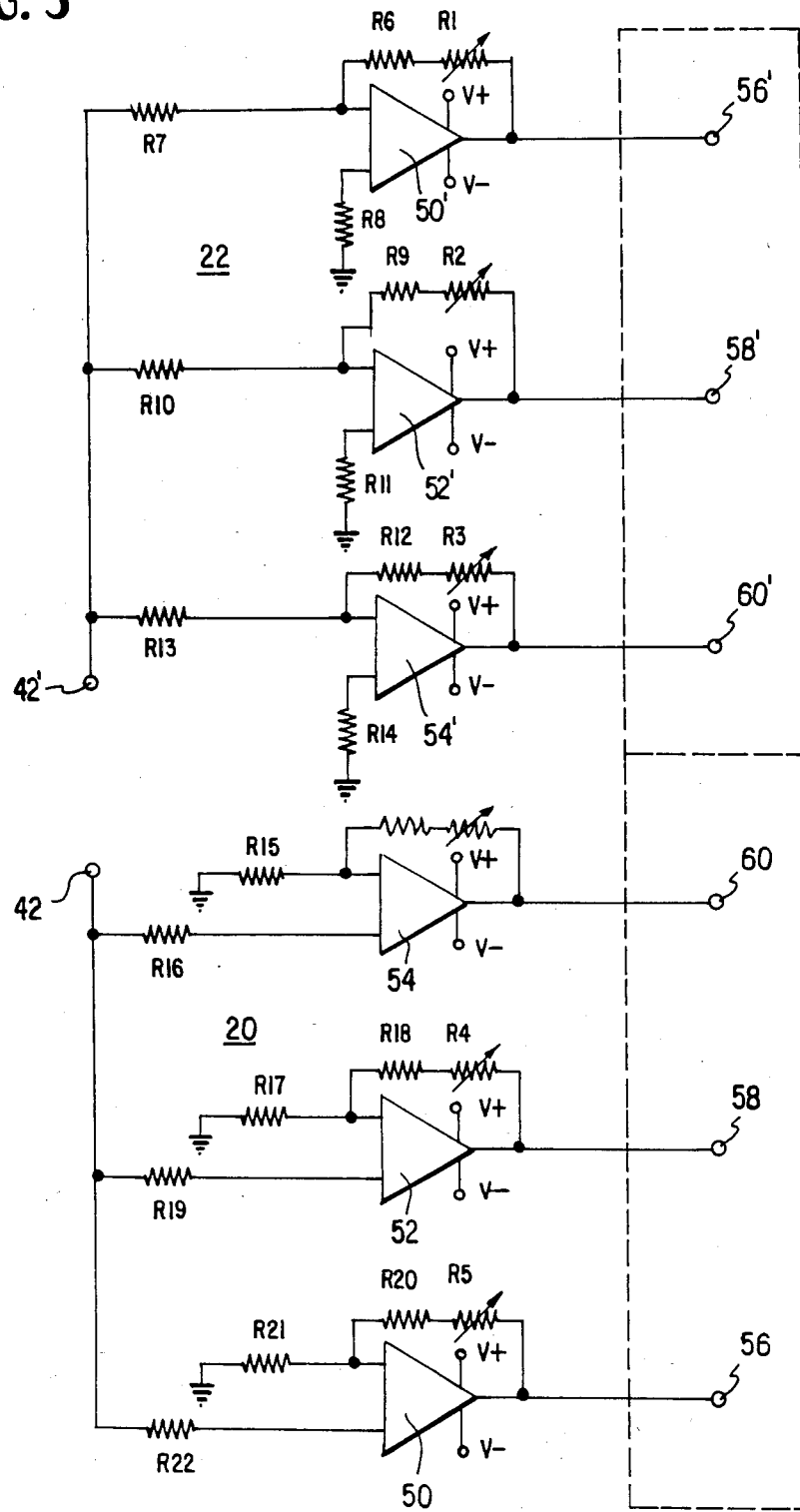
FIG. 3 is a circuit diagram of the signal resolution enhancement circuitry of FIG. 1.

Referring now to FIG. 3, the output signals occurring at terminals 42 and 42' are respectively applied to DC operational amplifiers 50–54 and 50'–54', the output terminals for these amplifiers respectively being 56–60 and 56'–60'. Amplifiers 50 and 50' have gains of typically 100, amplifiers 52 and 52' gains of 10 and amplifiers 54 and 54' have gains of 1. Amplifiers 50 and 50' are associated with the low amplitude portion extending from 0–50 mv of the 0–5,000 mv range while amplifiers 52 and 52' are associated with the intermediate range extending between 50 and 500 mv, while amplifiers 54 and 54' are associated with the high range extending from 500–5,000 mv. By providing increased amplification for the lower amplitude ranges with respect to the high range, the resolution of the lower amplitude ranges is enhanced which thereby contributes to the overall accuracy of the measuring system. The signal at terminal 42 is applied to the non-inverting inputs of amplifiers 50–54 while the signal at terminal 42' is applied to the inverting inputs of amplifiers 50'–54'. Thus, the outputs at terminals 56–60 and 56'–60' are all of the same polarity.

Figure 4A:
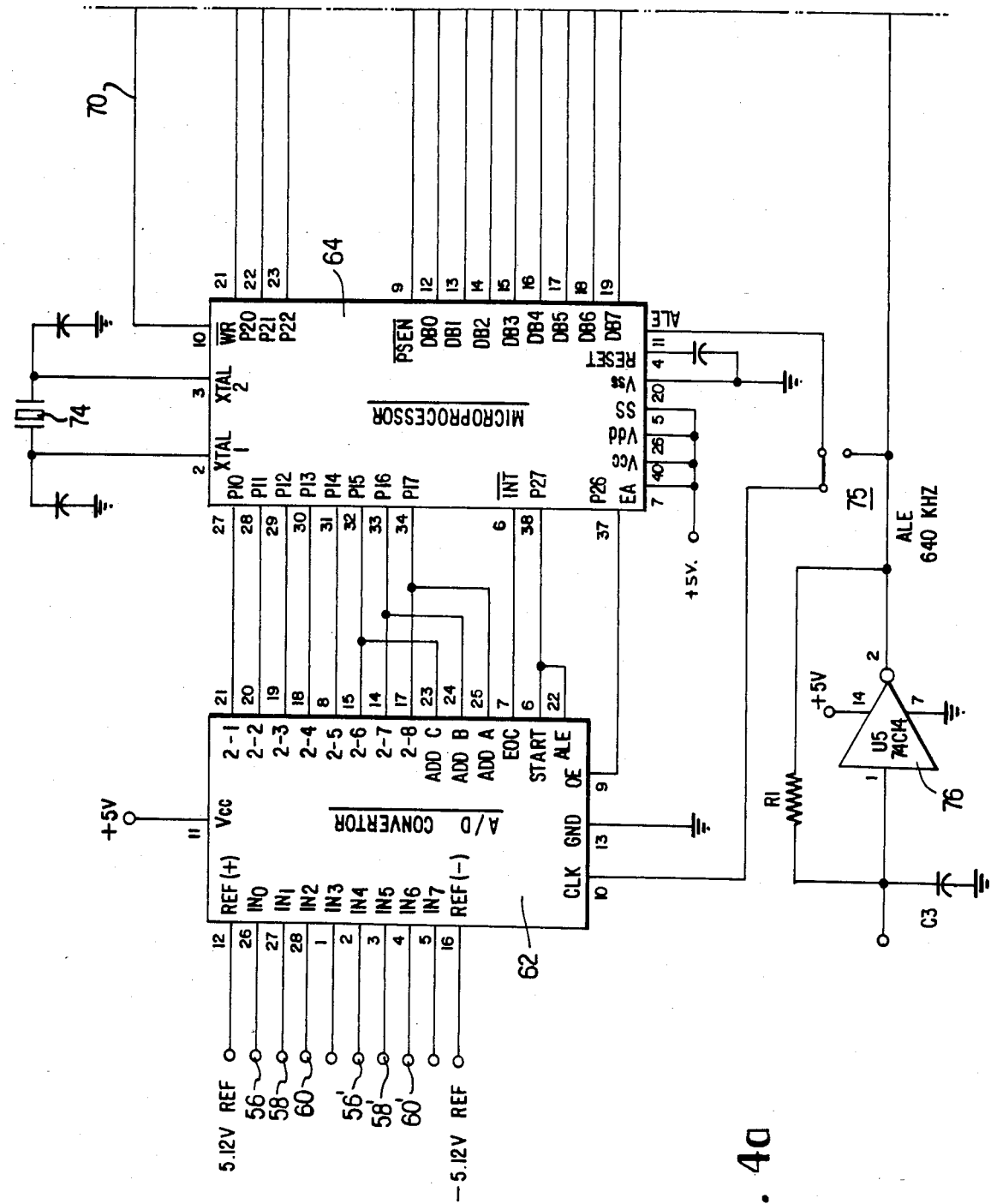
FIGS. 4A and 4B show a block diagram of the peak value determination circuitry of FIG. 1.
Figure 4B:
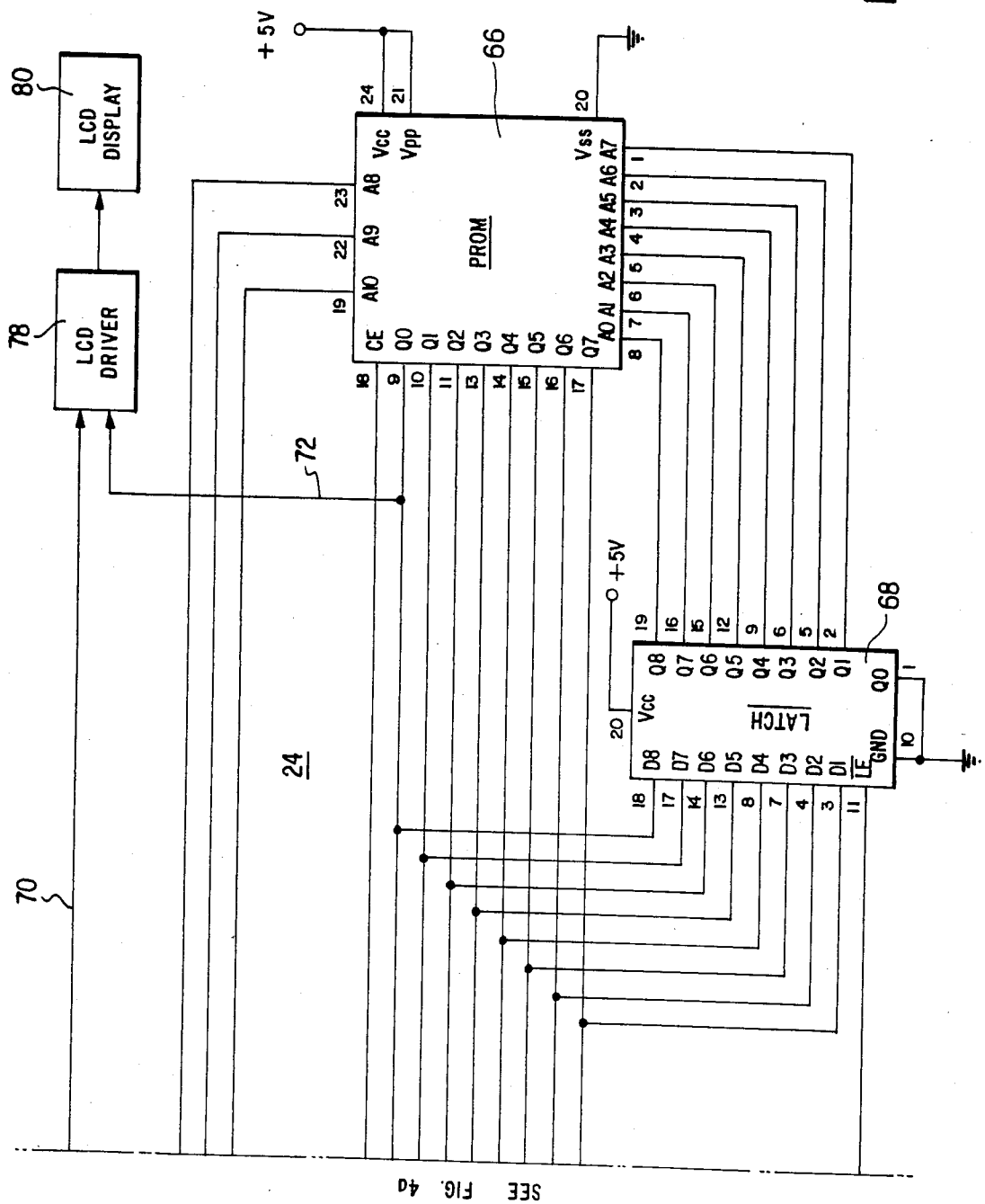

Referring now to FIGS. 4A and 4B, the peak value determination circuitry 24 comprises an analog-to-digital converter 62 which is responsive to the output signals occurring at terminals 56–60 and 56'–60'. The digital signals are applied to microprocessor 64, which is programmed to make the peak value determinations and to generate appropriate output signals for display, the program for the microprocessor being stored in PROM 66. Data including detected peak values is sequentially applied to line 70, a latch 68 being conventionally employed to store appropriate variables during this time. A clock signal is also applied to line 72. The data and clock signals occurring on lines 70 and 72 are applied to LCD driver 78 which, in turn, drives LCD display 80.

The processor is controlled by a crystal 74, the operating frequency of which is typically 3.58 megahertz. If it is desired to run the system at a higher frequency, the crystal may be changed or frequency dividing circuits in the microprocessor may be modified. If the system is operated at a higher frequency, a clock 76 may be employed for A/D converter 62. That is, when switch 75 is in the position shown, the system operates at a lower frequency and the clock pulses for the A/D converter are supplied through switch 75 from the microprocessor. However, if the microprocessor is operated at a higher frequency, the A/D converter may not be able to operate at this frequency and thus, the switch 75 will be switched to connect the clock 76 to the converter 62 to thereby provide it with a clock of a frequency suitable for the converter.

Figure 5:
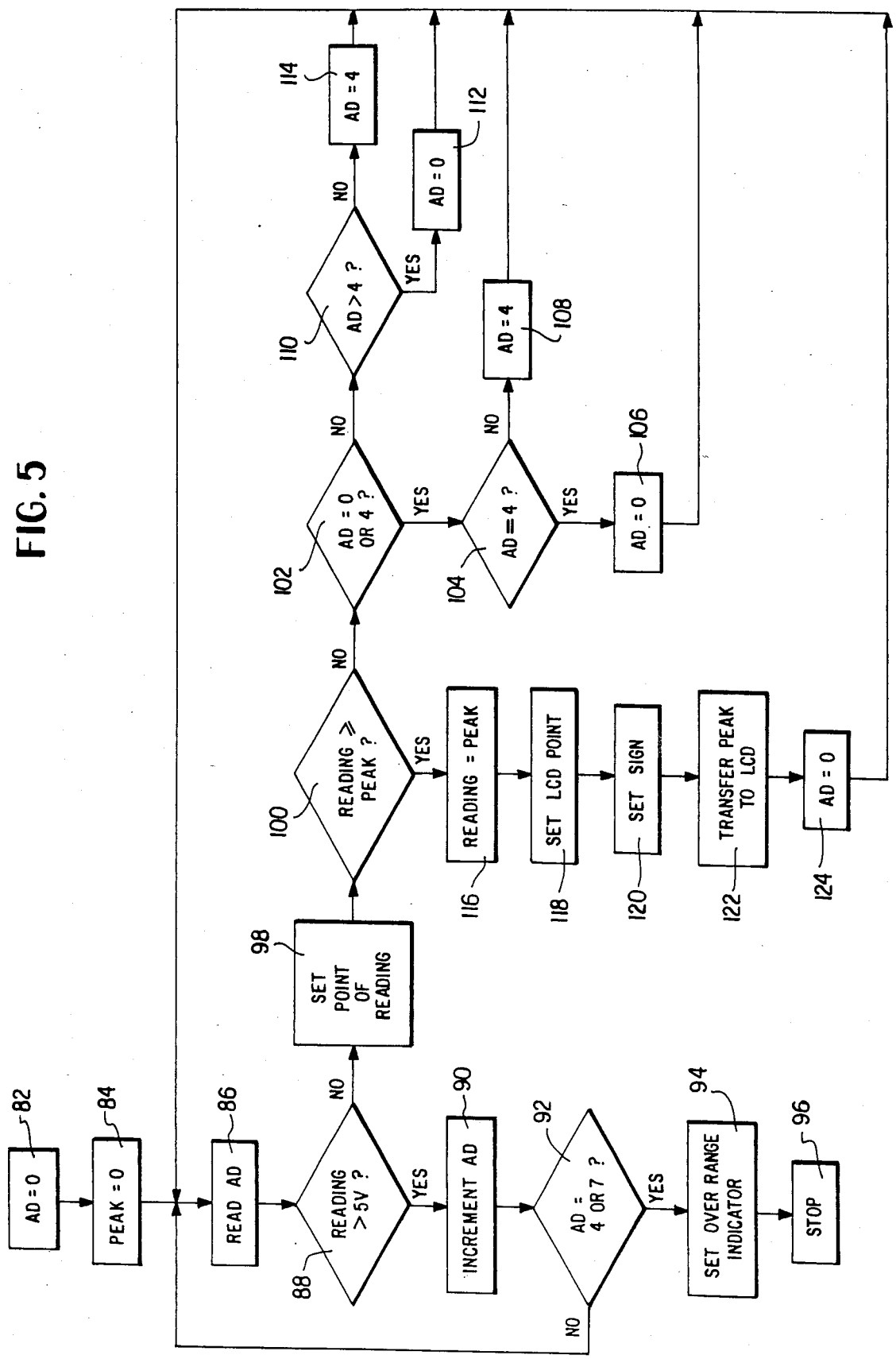
FIG. 5 is a flow chart of an illustrative program employed in the peak value determination circuitry of FIGS. 4A and 4B.

Referring now to FIG. 5, a flow chart illustrating the essential steps of the program stored in PROM 66 is illustrated. Each time the spike detector is re-set, the microprocessor is set to read the first channel output from A/D converter 62. This output corresponds to the positive 0–50 mv range signal occurring at terminal 56. This is accomplished by setting AD=0 in block 82. The channel associated with the positive 50–500 mv range is designated AD=1 while the positive 500–5,000 mv range channel is desginated AD=2. The negative 0–50 mv channel is designated AD=4, the negative 50–500 mv channel is designated AD=5 and the negative 500–5,000 my channel is designated AD=6. Channel 3 may be used for a battery measurement while channel 7 is typically not used, but, of course, may be used if needed.

Also, the initial peak value, which is stored in a microprocessor register, is set to zero as indicated at block 84. The first channel is then read as indicated at block 86.

A comparison is then made at block 88 to determine whether the channel reading exceeds the range for that channel. Thus, for example, referring to FIG. 3, amplifier 50 amplifies the input signal applied thereto by 100. As long as the input signal is 50 mv or less, the output signal therefrom will be 5 volts or less. However, if the applied signal is 250 mv, the output signal will be 25 volts, this indicating that the detected peak should be processed by amplifier 52 rather than amplifier 50. Since amplifier 52 amplifies by 10, the output occurring thereat will be 2.5 volts for a 250 mv input. Thus, in the foregoing manner, a determination can be made as to which channel should be processed in determining the value of the detected peak voltage. Hence, returning to the program of FIG. 5, if the reading is greater than 5 volts as determined at block 88, this indicates the processor should be switched to the next higher range. Accordingly, the AD setting is incremented at block 90 by 1.

Once AD is incremented at 90, a comparison is made at block 92 to determine if the detected voltage exceeds the 0–5,000 mv range for the detector. Thus, if the determination made at block 88 exceeds 5 volts for all channels, including the outputs of amplifiers 54 or 54', this means the detected voltage exceeds the 0–5,000 mv range established for the detector whereby an overrange indicator is set a block 94 and the program is stopped at 96. At this point, the operator, referring to FIG. 1, may switch switch 12 to its upper position to thereby insert attenuation circuit 14. Assuming the attenuation is 10-to-1, this would increase the detector's range ten-fold although there would be some decrease in resolution capability.

If the highest channel has not been exceeded, as determined by block 92, the program returns to block 86 to read the next higher channel. A comparison is again made at block 88 to determine whether the new channel reading exceeds the range for that channel. If the reading is less than 5 volts, the correct channel is being processed and a determination can now be made to see if the new reading exceeds the peak value of any previous readings. Thus, at block 98, the decimal point of the new reading is set, the location of the point depending on the channel currently being processed. Next, a determination is made at block 100 as to whether the channel reading exceeds the previously stored peak value. If it does not, a comparison is made at block 102 to determine whether either the positive or negative 0–50 mv range channel is currently being processed. If so, the microprocessor is switched to the other channel, this being effected at blocks 104, 106 and 108. Thus, if the positive 0–50 mv channel AD=0 is currently being processed, the microprocessor will be switched to the negative 0–50 mv channel AD=4. The program then returns to block 86 to read the negative 0–50 mv channel. In this manner, the program toggles between the lowest range positive and negative channels where background noise and the like occurs. By switching back and forth between these lower range channels, the detector remains prepared to immeditately detect a higher amplitude spike or pulse if one should occur. If, at block 102, it is determined the channel being read is one of the intermediate or upper range channels, the processor is switched back to either the initial positive or negative range channel depending on which channels were previously processed. Thus, if the negative range channels 5 or 6 were previously being processed, the processor would be switched back to initial positive channel AD=0 by blocks 110, 112, and 114.

If the channel reading exceeds the previously detected maximum peak, the program moves from block 100 to block 116 where the peak is set to this new reading. In this manner, the program updates the peak reading whenever a new peak exceeds the maximum of previous peaks. In particular, the new reading becomes the new peak at block 116. The program will move to block 118 to set the decimal point for the LCD read-out depending on which channel the new peak has occurred. The sign of the peak is set at block 120, this depending on whether AD is $0 \leq AD \leq 2$ or $4 \leq AD \leq 6$. The new peak reading is then transferred to the LCD at block 122. The program is then returned to the first channel at 124 where it continues to monitor the signals being applied from terminals 56–60 and 56'–60'.

The A/D readings by converter 62 are effected roughly every 64 instruction cycles of the FIG. 5 program. When operating in a mode of operation capable of detecting 100 nanosecond pulses, the terminals 56–60 and 56'–60' would thus typically be scanned every 1.3 milliseconds. In order to ensure that the voltages on capacitors 38 and 38' do not significantly leak off during the 1.3 millisecond intervals, these capacitors may typically be 1,000 pf. These values are small enough to permit the capacitor to be sufficiently charged by a pulse having a duration as short as 100 nanoseconds, while at the same time the capacitor is large enough to prevent significant leakage during the 1.3 millisecond interval. Thus, the capacitance value is such in conjunction with the high reverse impedance of FET's 34 and 34' and the high input impedances of amplifiers 40 and 40', the leakage is typically less than 1% during the 1.3 millisecond scanning interval. Hence, this interrelationship between peak detector circuits 16 and 18 and microprocessor 64 together with the resolution enhancing capability of circuits 20 and 22 enables the detector of the present invention to detect spikes of extremely short duration over a range of 0–5,000 mv with an accuracy of 1%.

If it is desired to detect even shorter duration spikes such as those having a width of 10 nanoseconds or more, the detector of this invention may be modified so that the terminals 56–60 and 56'60' are scanned every 800 nanoseconds. This would entail a change in the values of capacitors 38 and 38' to 180 pf and would again establish the above described interrelationship between the peak detector circiuts 16 and 18 and microprocessor 64.

All resistor values shown in the figures of the drawing are in ohms while capacitors are in microfarads unless otherwise specified. The circuit blocks may be obtained from National Semiconductor Corporation, their designations being as follows:

amplifiers 32 and 32': LH0032
amplifiers 40 and 40': LH0033
amplifiers 50–54 and 50'–54': LF412CN, dual in-line JFET Op Amp
A/D converter 62: ADC0808 or 0809
microprocessor 64: 80C39N-6
EPROM 66: NM27C16
latch 68: 74C 373
LCD driver 78: MM5453
LCD 26 4.5 digit (D5345) (40 pin DIL) by crystaloid The foregoing CMOS circuitry is used in the lower frequency mode of operation discussed above. Regular MOS circuitry would be used for the higher frequency mode of operation.

It is to be understood that the above detailed description of the various embodiments of the invention is provided by way of example only. Various details of design and construction may be modified without departing from the true spirit and scope of the invention as set forth in the appended claims.

I claim:

1. Circuitry for detecting a pulse of short duration including
   storage means for storing the peak amplitude of said pulse;
   signal resolution enhancement means responsive to said storage means for establishing a plurality of channels respectively corresponding to a plurality of signal amplitude ranges where the range of signal amplitudes for each successive range is larger than that of the range preceding it, said signal resolution means including signal amplification means for each range; and
   peak signal detecting means responsive to said signal resoltuion enhancement means for (a) scanning said channels, (b) selecting one of said channels, said selected channel being such that said peak amplitude falls within the range for said channel, and (c) detecting said peak amplitude of the pulse.

2. Circuitry as in claim 1 where the duration of said pulse is as small as 10 nanoseconds.

3. Circuitry as in claim 2 where said duration is as small as 100 nanoseconds.

4. Circuitry as in claim 1 where said storage means includes capacitive storage means for storing a voltage corresponding to said peak voltage and where scanning means includes means for scanning all said channels in a predetermined time interval and where the value of said capacitive storage means is sufficiently small that it can be fully charged by said pulse in a time period less than said predetermined time interval and yet sufficiently large that the value of peak voltage remains substantially constant over said predetermined time interval
   whereby the peaks of pulses of short duration can be detected with high resolution.

5. Circuitry as in claim 4 where the value of said capacitive storage means is 1,000 pf, the predetermined scanning time interval is 1.3 milliseconds and the width of said pulse is as small as about 100 nanoseconds.

6. Circuitry as in claim 4 where the value of said capactive storage means is 180 pf, the predetermined scanning time interval is 800 nanoseconds and the width of said pulse is as small as about 10 nanoseconds.

7. Circuitry as in claim 1 where said storage means includes first storage means for storing the peak amplitude of positive going pulses and second storage means for storing th peak amplitude of negative going pulses and where said signal resolution enhancement means includes a first plurality of said channels for said positive going pulses and a second plurality of said channels for said negative going pulses.

8. Circuitry as in claim 7 where said peak signal detecting means includes means for toggling between one channel corresponding to the smallest signal amplitude range for said positive going pulses and another channel corresponding to the smallest signal amplitude range for said negative going pulses.

9. Circuitry as in claim 1 where said peak signal detecting means includes a microprocessor for implementing said (a), (b), and (c) functions.

10. Circuitry as in claim 1 where the amount of amplification of said signal amplification means for each range is smaller than that of the range preceding it.

11. Circuitry as in claim 1 where the smallest of said signal amplitude ranges extends from 0 volts to a first predetermined value, a second of said ranges extends from 0 volts to a second predetermined value greater than said first predetermined value, and a third range extends from 0 volts to a third predetermined value greater than said second value.

12. Circuitry as in claim 11 where said first, second and third values are 50 millivolts, 500 millivolts and 5,000 millivolts respectively.

13. Circuitry as in claim 11 including attenuation means and means for switching said pulse to said storage means through said attenuation means so that the peak amplitude of said pulse will not exceed said third predetermined value.

14. Circuitry as in claim 4 where said storage means includes a field effect transistor, the gate of the field effect transistor being responsive to said pulse, a voltage source connected to an input terminal of the field effect transistor and said capacitive storage means being connected to an output terminal of the field effect transistor so that said capacitive storage means stores said peak value of said pulse in response to the pulse being applied to the gate of the field effect transistor, the capacitance value of said capacitive storage means and the reverse impedance of said field effect transistor being such that leakage of the stored peak value from the capacitive storage means is approximately less than 1% when said predetermined time interval for scanning all said channels is about 1.3 milliseconds.

15. Circuitry as in claim 14 where said storage means includes a voltage follower amplifier, the input of which is responsive to the peak voltage stored by said capacitive storage means, the input impedance of said voltage follower amplifier being such that, in conjunction with the capacitance value of said capacitive storage means and the reverse impedance of said field effect transistor, said leakage is less than said 1%.

16. Circuitry as in claim 15 where said storage means includes a differential amplifier, one input of which is responsive to said pulse and the other input of which is responsive to the output from said voltage follower amplifier so that the output from the differential amplifier is reduced to substantially zero when the output from the voltage follower amplifier rises to said peak voltage.

* * * * *